(12) United States Patent
Chao et al.

(10) Patent No.: US 12,044,766 B2
(45) Date of Patent: Jul. 23, 2024

(54) PROGRAM BURNING DEVICE AND CURRENT-PROTECTION DETECTION METHOD THEREOF

(71) Applicant: Delta Electronics, Inc., Taoyuan (TW)

(72) Inventors: Kuo-Heng Chao, Taoyuan (TW); Chia-Hsiang Chuang, Taoyuan (TW); Ming-Jen Chao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 268 days.

(21) Appl. No.: 17/840,542

(22) Filed: Jun. 14, 2022

(65) Prior Publication Data

US 2023/0123922 A1 Apr. 20, 2023

Related U.S. Application Data

(60) Provisional application No. 63/256,189, filed on Oct. 15, 2021.

(30) Foreign Application Priority Data

Mar. 24, 2022 (CN) .......................... 202210296967.3

(51) Int. Cl.
*G01R 31/28* (2006.01)
*G01R 19/00* (2006.01)
(Continued)

(52) U.S. Cl.
CPC ......... *G01R 35/00* (2013.01); *G01R 19/0038* (2013.01); *G01R 31/2837* (2013.01);
(Continued)

(58) Field of Classification Search
None
See application file for complete search history.

(56) References Cited

U.S. PATENT DOCUMENTS

| | | |
|---|---|---|
| 9,906,015 B2 | 2/2018 | Hayashi et al. |
| 2021/0021197 A1 | 1/2021 | Cheng et al. |
| 2021/0036506 A1 | 2/2021 | Chen et al. |

FOREIGN PATENT DOCUMENTS

| | | |
|---|---|---|
| CN | 1138246 C | 2/2004 |
| CN | 101452017 B | 10/2011 |

(Continued)

OTHER PUBLICATIONS

English translation of TW 201547144 A Dec. 16, 2015 (Year: 2015).*

(Continued)

*Primary Examiner* — Jermele M Hollington
(74) *Attorney, Agent, or Firm* — KIRTON McCONKIE; Evan R. Witt

(57) ABSTRACT

The present disclosure a program burning device configured to read or write to a program burning interface. The program burning device includes a microprocessor, a programming drive circuit and an overcurrent protection circuit. The microprocessor outputs a first test signal or a second test signal. The programming drive circuit outputs a high driving voltage or a low driving voltage to the program burning interface. After the programming drive circuit outputs the low driving voltage for a preset time, the programming drive circuit outputs the high driving voltage to make the program burning interface form a high impedance. Afterwards, the overcurrent protection circuit receives the first test signal to trigger the overcurrent protection, and then receives the second test signal to trigger the undercurrent protection. If triggering the overcurrent protection and the undercurrent protection are continuously failed over a preset number of times, the microprocessor determines that current protection is failed.

13 Claims, 6 Drawing Sheets

(51) Int. Cl.
  *G01R 35/00* (2006.01)
  *H02H 1/00* (2006.01)
  *H02H 3/04* (2006.01)
  *H02H 3/10* (2006.01)
  *H02H 7/08* (2006.01)
  *H02K 11/33* (2016.01)
  *H02P 6/20* (2016.01)
  *H02P 6/24* (2006.01)
  *H02P 27/06* (2006.01)
  *H03K 17/081* (2006.01)
  *H03K 17/687* (2006.01)
  *H02P 6/182* (2016.01)

(52) U.S. Cl.
  CPC ....... *G01R 31/2839* (2013.01); *H02H 1/0007* (2013.01); *H02H 3/044* (2013.01); *H02H 3/10* (2013.01); *H02H 7/08* (2013.01); *H02K 11/33* (2016.01); *H02P 6/20* (2013.01); *H02P 6/24* (2013.01); *H02P 27/06* (2013.01); *H03K 17/08104* (2013.01); *H03K 17/687* (2013.01); *H02P 6/182* (2013.01)

(56) References Cited

FOREIGN PATENT DOCUMENTS

| CN | 103592552 | A |   | 2/2014  |          |
|----|-----------|---|---|---------|----------|
| CN | 104267277 | A |   | 1/2015  |          |
| CN | 106411309 | B |   | 9/2019  |          |
| CN | 111244882 | A | * | 6/2020  | H02H 3/08 |
| CN | 112946400 | A |   | 6/2021  |          |
| TW | 201319594 | A1|   | 5/2013  |          |
| TW | 201547144 | A | * | 12/2015 |          |
| TW | M549352   | U |   | 9/2017  |          |
| TW | I699068   | B |   | 7/2020  |          |

OTHER PUBLICATIONS

English translation of CN 111244882 A Jun. 5, 2020 (Year: 2020).*
Young-Woo Lee et al., "A low-cost concurrent TSV test architecture with lossless test output compression scheme", PLOS ONE, Aug. 23, 2019.

* cited by examiner

PROGRAM BURNING DEVICE AND CURRENT-PROTECTION DETECTION METHOD THEREOF

CROSS-REFERENCE TO RELATED APPLICATION

This application claims the benefit of U.S. Provisional Application No. 63/256,189 filed on Oct. 15, 2021, and entitled "TROUBLESHOOTING METHOD AND OVERCURRENT PROTECTION SYSTEM FOR CURRENT SENSOR AND SAFETY MECHANISM FOR ABNORMAL POWER SUPPLY". This application also claims priority to China Patent Application No. 202210296967.3 filed on Mar. 24, 2022. The entire contents of the above-mentioned patent applications are incorporated herein by reference for all purposes.

FIELD OF THE INVENTION

The present disclosure relates to a program burning device and a current-protection detection method thereof, and more particularly to a program burning device and a current-protection detection method thereof capable of determining whether the current protection is normal.

BACKGROUND OF THE INVENTION

The conventional program burning device needs external tool while programming the controller, and usually the external tool is used with auxiliary independent components (e.g., current sensor and Hall sensor). In order to save space, more and more integrated products integrate the auxiliary independent components, the program burning device and the controller together. However, in the integrated products, the overcurrent protection circuit is triggered to operate only when the hardware is abnormal (e.g., external motor failure). In other words, the overcurrent protection circuit doesn't operate under normal circumstance. Therefore, after long-term usage, if the overcurrent protection circuit is abnormal, the failure of the overcurrent protection circuit cannot be detected in time. Accordingly, the overcurrent protection circuit may not function when the hardware actually fails.

Therefore, there is a need of providing a program burning device and a current-protection detection method thereof to obviate the drawbacks encountered from the prior arts.

SUMMARY OF THE INVENTION

It is an objective of the present disclosure to provide a program burning device and a current-protection detection method thereof, which actively test the overcurrent protection circuit for ensuring that the overcurrent protection circuit can operate normally.

In accordance with an aspect of the present disclosure, there is provided a program burning device configured to read or write to a program burning interface. The program burning device includes a microprocessor, a programming drive circuit and an overcurrent protection circuit. The microprocessor is configured to output a first test signal or a second test signal. The first test signal has a high voltage level, and the second test signal has a low voltage level. The programming drive circuit is controlled by the microprocessor to output a high driving voltage or a low driving voltage to the program burning interface. The overcurrent protection circuit is coupled to the first and second test signals for triggering an overcurrent protection or an undercurrent protection through the microprocessor. After the programming drive circuit outputs the low driving voltage for a preset time, the programming drive circuit outputs the high driving voltage to make the program burning interface form a high impedance. After the program burning interface forms the high impedance, the overcurrent protection circuit receives the first test signal to trigger the overcurrent protection, and the overcurrent protection circuit receives the second test signal to trigger the undercurrent protection after the overcurrent protection is triggered. If triggering the overcurrent protection and the undercurrent protection are continuously failed over a preset number of times, the microprocessor determines that a current protection is failed.

In accordance with another aspect of the present disclosure, there is provided a current-protection detection method of a program burning device. The program burning device is configured to read or write to a program burning interface. The current-protection detection method includes: (a) providing a first test signal or a second test signal by a microprocessor, the first test signal having a high voltage level, and the second test signal having a low voltage level; (b) controlling a programming drive circuit to provide a high driving voltage or a low driving voltage by the microprocessor; (c) receiving the first and second test signals by an overcurrent protection circuit for triggering an overcurrent protection or an undercurrent protection through the microprocessor; (d) providing the low driving voltage to the program burning interface for a preset time; (e) providing the high driving voltage to the program burning interface after the preset time to make the program burning interface form a high impedance; (f) after forming the high impedance, receiving the first test signal by the overcurrent protection circuit to trigger the overcurrent protection; and (g) after triggering the overcurrent protection, receiving the second test signal by the overcurrent protection circuit to trigger the undercurrent protection. If triggering the overcurrent protection and the undercurrent protection are continuously failed over a preset number of times, the microprocessor determines that a current protection is failed.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
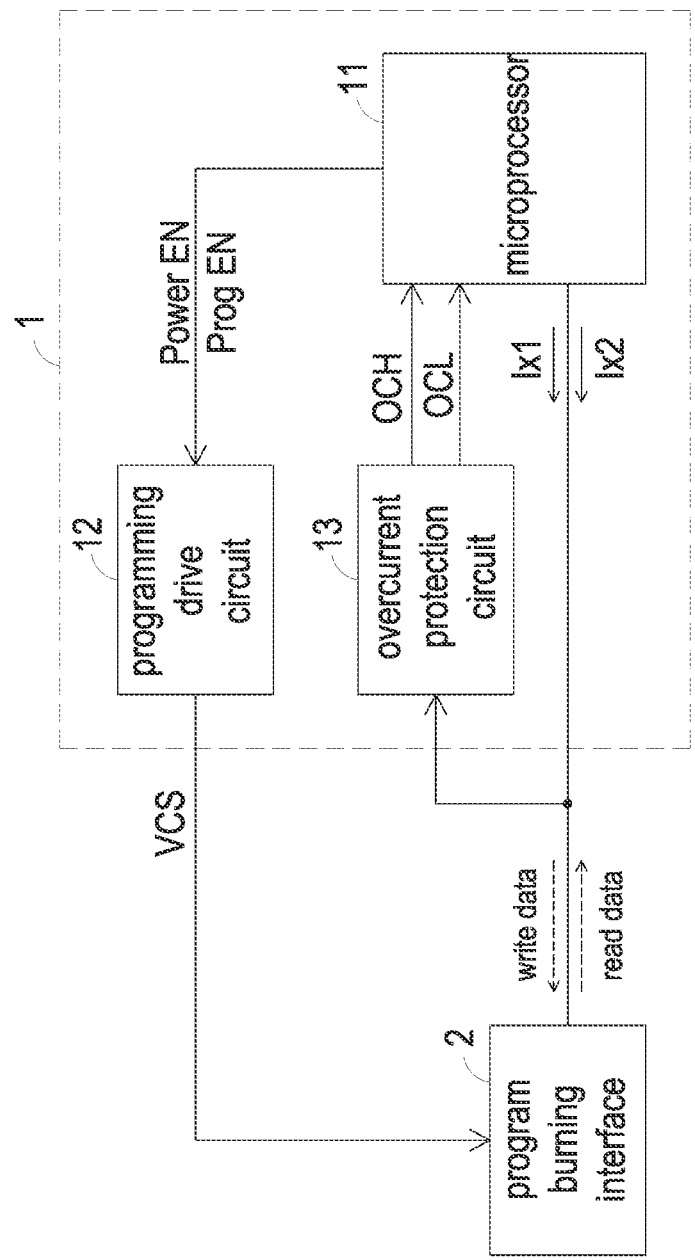
FIG. 1 is a schematic block diagram illustrating a program burning device according to an embodiment of the present disclosure.

FIG. 1 is a schematic block diagram illustrating a program burning device 1 according to an embodiment of the present disclosure. As shown in FIG. 1, the program burning device 1 is configured to read or write to a program burning interface 2. The program burning interface 2 is for example but not limited to a Hall sensor or a current sensor. The program burning device 1 includes a microprocessor 11, a programming drive circuit 12, and an overcurrent protection circuit 13. The programming drive circuit 12 is electrically coupled between the microprocessor 11 and the program burning interface 2. The overcurrent protection circuit 13 is electrically coupled between the microprocessor 11 and the program burning interface 2. The microprocessor 11 is configured to output a first test signal Ix1 or a second test signal Ix2. The first test signal Ix1 has a high voltage level, and the second test signal Ix2 has a low voltage level, and the high voltage level is higher than the low voltage level.

The microprocessor 11 controls the programming drive circuit 12 to output a high driving voltage (e.g., 9V) or a low driving voltage (e.g., 5V) to the program burning interface 2, and the high driving voltage is greater than the low driving voltage. The over-current protection circuit 13 is coupled to the first test signal Ix1 and the second test signal Ix2 for triggering an overcurrent protection OCH and an undercurrent protection OCL respectively through the microprocessor 11. As shown in FIG. 1, the microprocessor 11 outputs a power enable signal PowerEN and a programming enable signal ProgEN for controlling the programming drive circuit 12. In this embodiment, the power enable signal PowerEN is used to enable or disable the programming drive circuit 12 (or to determine whether providing power to the programming drive circuit 12). The programming enable signal ProgEN is used to control the programming drive circuit 12 to output the high driving voltage (e.g., 9V) or the low driving voltage (e.g., 5V).

Figure 2:
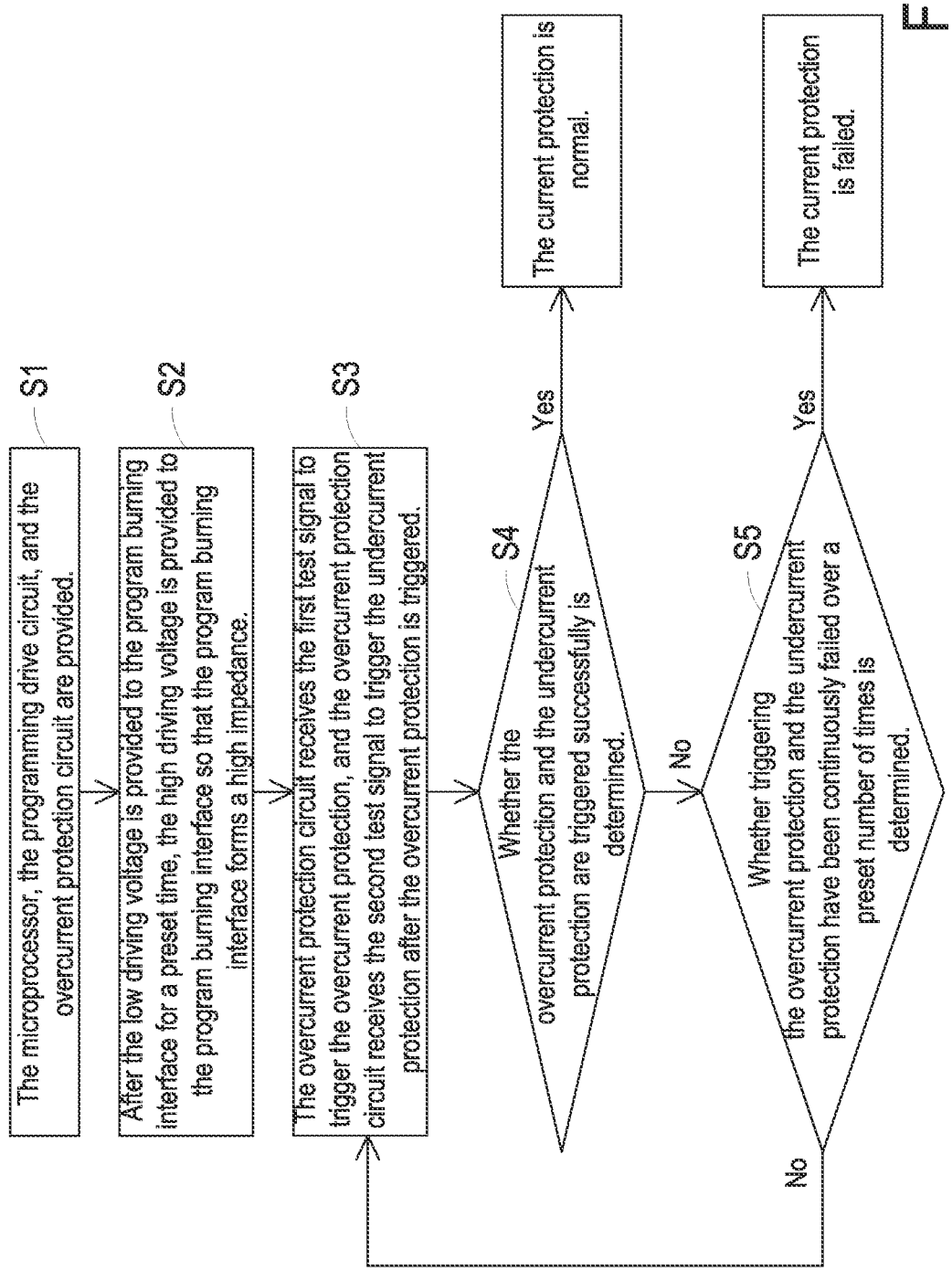
FIG. 2 is a schematic flow chart illustrating a current-protection detection method according to an embodiment of the present disclosure.

FIG. 2 is a schematic flow chart illustrating a current-protection detection method according to an embodiment of the present disclosure. The current-protection detection method is applied in the program burning device 1. The current-protection detection method is described according to FIG. 1 and FIG. 2 as follows.

Firstly, in the step S1, the microprocessor 11, the programming drive circuit 12, and the overcurrent protection circuit 13 are provided. As mentioned above, the first test signal Ix1 or the second test signal Ix2 is provided by the microprocessor 11. The programming drive circuit 12 is controlled by the microprocessor 11 to provide the high driving voltage or the low driving voltage. The first test signal Ix1 or the second test signal Ix2 is received by the overcurrent protection circuit 13 for triggering the overcurrent protection OCH or the undercurrent protection OCL through the microprocessor 11.

Then, in the step S2, after the programming drive circuit 12 outputs the low driving voltage to the program burning interface 2 for a preset time (e.g., 10 ms), the programming drive circuit 12 outputs the high driving voltage to the program burning interface 2 so that the program burning interface 2 forms a high impedance.

After the program burning interface 2 forms the high impedance, in the step S3, the overcurrent protection circuit 13 receives the first test signal Ix1 to trigger the overcurrent protection OCH, and the overcurrent protection circuit 13 receives the second test signal Ix2 to trigger the undercurrent protection OCL after the overcurrent protection OCH is triggered.

In the step S3, triggering the overcurrent protection OCH and the undercurrent protection OCL in the step S3 may be successful or failed. Therefore, in the step S4, the microprocessor 11 determines whether the overcurrent protection OCH and the undercurrent protection OCL are triggered successfully. If the determining result of the step S4 is satisfied, the microprocessor 11 determines that the current protection (including the overcurrent protection OCH and the undercurrent protection OCL) is normal. When the microprocessor 11 determines that the current protection is normal, the program burning device 1 starts to read or write data to the program burning interface 2 normally. If the determining result of the step S4 is not satisfied, it means that triggering the overcurrent protection OCH and the undercurrent protection OCL are failed, and then the step S5 is performed.

In the step S5, the microprocessor 11 determines whether triggering the overcurrent protection OCH and the undercurrent protection OCL have been continuously failed over a preset number of times (for example but not limited to two times). If the determining result of the step S5 is not satisfied, the step S3 is performed again to try triggering the overcurrent protection OCH and the undercurrent protection OCL again. On the contrary, if the determining result of the step S5 is satisfied, the microprocessor 11 determines that the current protection is failed.

Accordingly, the microprocessor 11 determines that the current protection is failed when triggering the overcurrent protection OCH and the undercurrent protection OCL have been continuously failed over the preset number of times. When the microprocessor 11 determines that the current protection is failed, the microprocessor 11 sends out a warning or even sends out warning correspondingly to remind the user. In addition, if triggering the overcurrent protection OCH and the undercurrent protection OCL are continuously failed less than the preset number of times, the microprocessor 11 still determines that the current protection is normal once the overcurrent protection OCH and the undercurrent protection OCL are successfully triggered. Therefore, the program burning device 1 and the current-protection detection method of the present application actively test the overcurrent protection circuit 13 for ensuring that the overcurrent protection circuit 13 can operate normally, thereby avoiding the failure of the current protection function caused by the abnormal overcurrent protection circuit 13.

Figure 3:
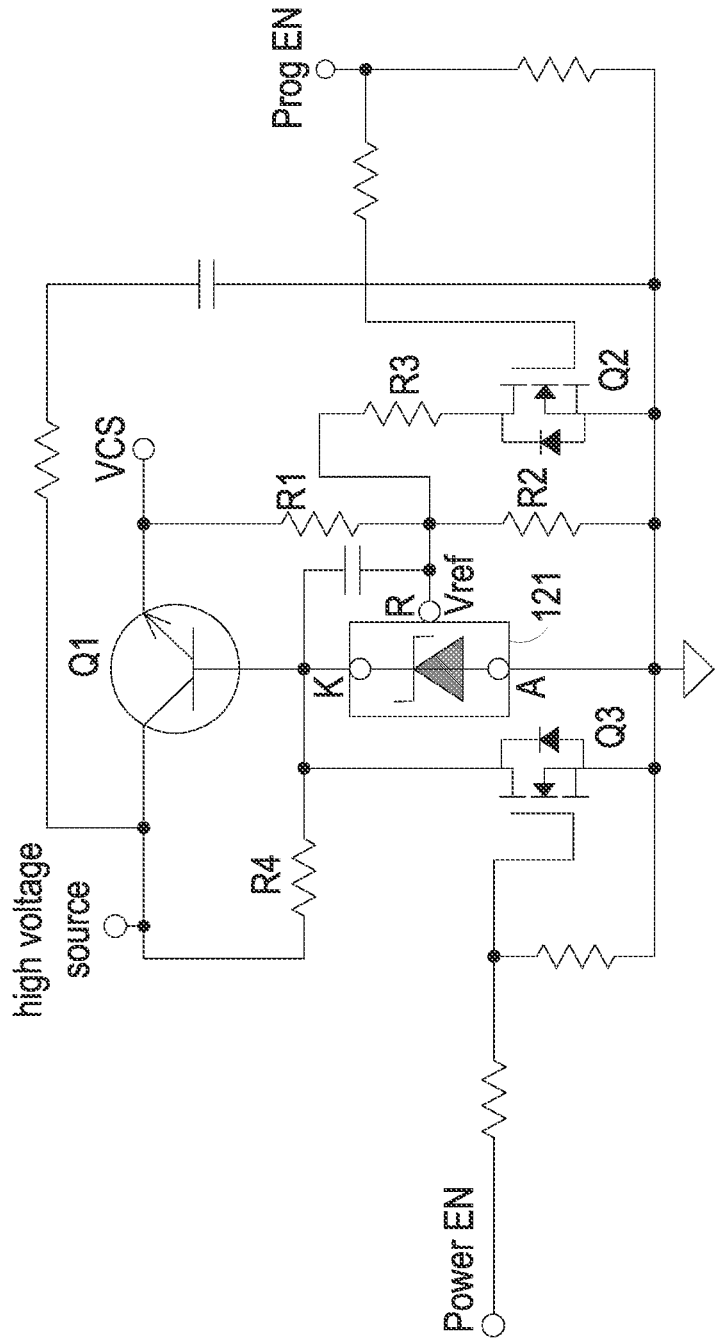
FIG. 3 is a schematic circuit diagram illustrating the programming drive circuit of FIG. 1.

FIG. 3 is a schematic circuit diagram illustrating the programming drive circuit 12 of FIG. 1. In an embodiment, as shown in FIG. 3, the programming drive circuit 12 includes a voltage regulator 121, an NPN transistor Q1, a first resistor R1, a second resistor R2, a third resistor R3, and a field effect transistor Q2. The voltage regulator 121 includes a cathode terminal K, an anode terminal A, and a reference terminal R. The anode terminal A is connected to a ground voltage, and the reference terminal R provides a reference voltage Vref. A collector terminal of the NPN transistor Q1 is coupled to a high voltage source (e.g., 12V), and a base terminal of the NPN transistor Q1 is coupled to the cathode terminal K. A first terminal of the first resistor R1 is connected to an emitter terminal of the NPN transistor Q1 to form a driving output terminal VCS of the programming drive circuit 12, and a second terminal of the first resistor R1 is connected to the reference terminal R. The programming drive circuit 12 provides the high driving voltage or the low driving voltage to the program burning interface 2 through the driving output terminal VCS. A first terminal of the second resistor R2 is connected to the reference terminal R, and a second terminal of the second resistor R2 is connected to the ground voltage. A first terminal of the third resistor R3 is connected to the reference terminal R. A drain terminal of the field effect transistor Q2 is connected to a second terminal of the third resistor R3, a source terminal of the field effect transistor Q2 is connected to the ground voltage, and a gate terminal of the field effect transistor Q2 is coupled to the programming enable signal ProgEN of the microprocessor 11. In addition, the programming drive circuit 12 is further coupled to the power enable signal PowerEN of the microprocessor 11.

The microprocessor 11 reads or writes data to the program burning interface 2 through controlling the programming drive circuit 12. The specific control method is exemplified as follows. After the microprocessor 11 briefly turns on the transistor Q3 and turns off the power of the driving output terminal VCS, when the microprocessor 11 turns on the field effect transistor Q2, the programming drive circuit 12 provides the high driving voltage through the driving output terminal VCS. As the program burning interface 2 receives the high driving voltage, the microprocessor 11 reads or writes data to the program burning interface 2. Afterwards, when the microprocessor 11 turns off the field effect transistor Q2, the programming drive circuit 12 provides the low driving voltage through the driving output terminal VCS. As the program burning interface 2 receives the low driving voltage, the microprocessor 11 completes reading or writing data to the program burning interface 2, the program burning interface 2 outputs a voltage signal, and the microprocessor 11 reads the voltage signal from the program burning interface 2.

In the circuit structure shown in FIG. 3, the operating current required by the voltage regulator 121 is provided to the voltage regulator 121 through a resistor R4, and the resistors R1, R2 and R3 form a feedback circuit. The voltage on the driving output terminal VCS is divided by the resistors R1, R2 and R3 and then enters the reference terminal R of the voltage regulator 121. The voltage regulator 121 controls the voltage on the cathode terminal K to drive the NPN transistor Q1, so as to realize the voltage stabilization control for the driving output terminal VCS.

In addition, whether the voltage on the driving output terminal VCS is zero is controlled through the power enable signal PowerEN, and the driving output terminal VCS is controlled to provide the high driving voltage or the low driving voltage through the programming enable signal ProgEN, which would be described specifically as follows. As shown in FIG. 3, the power enable signal PowerEN drives the gate voltage of the transistor Q3, and the programming enable signal ProgEN drives the gate voltage of the field effect transistor Q2. When the transistor Q3 is turned on by the power enable signal PowerEN, the voltage on the driving output terminal VCS is zero. When the transistor Q3 is turned off by the power enable signal PowerEN, the field effect transistor Q2 is turned on or off by the programming enable signal ProgEN to affect the voltage division ratio of the feedback circuit formed by the resistors R1, R2 and R3, thereby controlling the driving output terminal VCS to provide the high driving voltage or the low driving voltage correspondingly.

Figure 4:
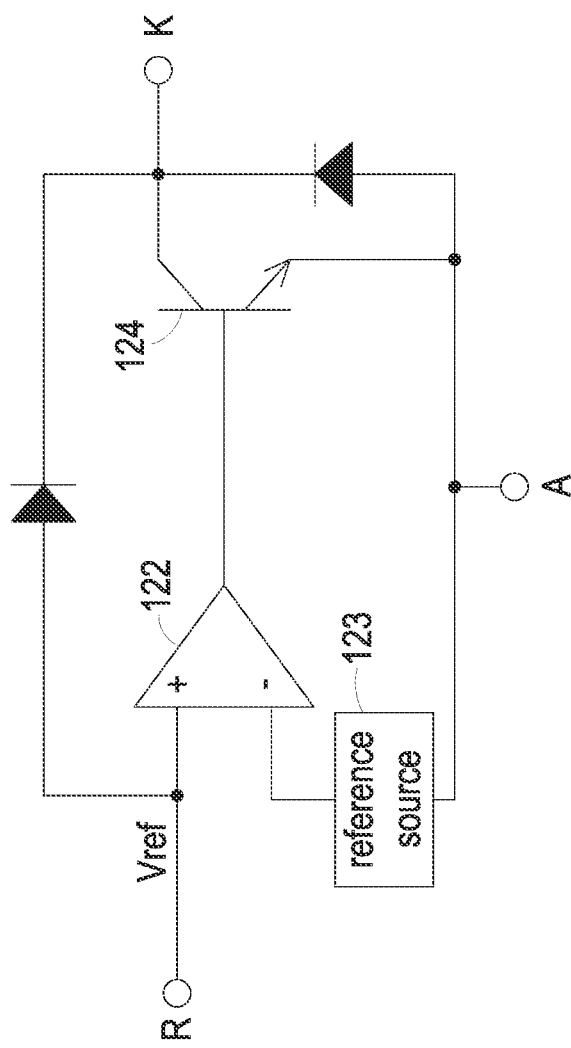
FIG. 4 is a schematic circuit diagram illustrating the voltage regulator of FIG. 3.

FIG. 4 is a schematic circuit diagram illustrating the voltage regulator 121 of FIG. 3. In an embodiment, as shown in FIG. 4, the voltage regulator 121 includes an amplifier 122, a reference source 123, and a transistor 124. The anode and cathode terminals of the amplifier 122 are coupled to the reference terminal R and the reference source 123 respectively. A collector terminal, an emitter terminal, and a base terminal of the transistor 124 are coupled to the cathode terminal K, the anode terminal A, and an output terminal of the amplifier 122 respectively. According to the characteristics of the amplifier, the current flowing through the transistor 124 is stable and unsaturated only when the reference voltage Vref on the reference terminal R approximates the voltage of the reference source 123. Even when the reference voltage Vref on the reference terminal R varies slightly, the current flowing through the transistor 124 also varies accordingly.

Figure 5:
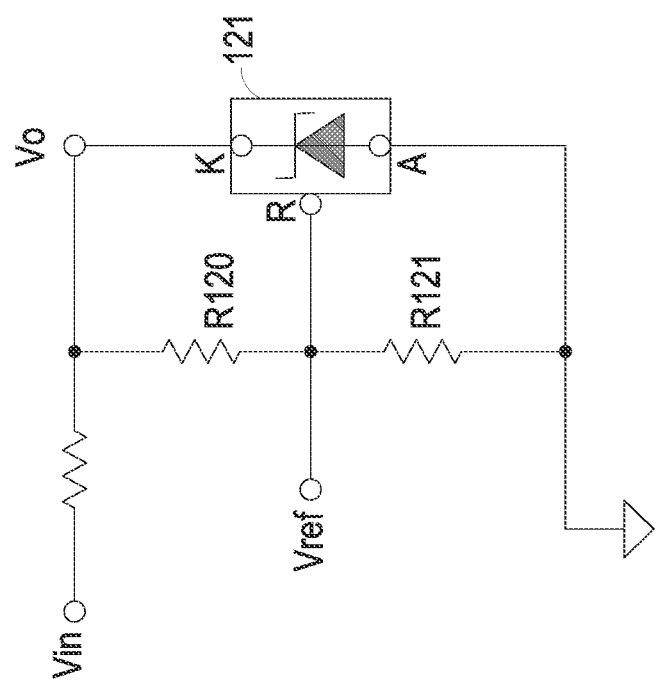
FIG. 5 is an equivalent circuit diagram schematically showing the work principle of the voltage regulator.

FIG. 5 is an equivalent circuit diagram schematically showing the work principle of the voltage regulator. The resistors R1, R2 and R3 in FIG. 3, which are used for division, can be equivalent to the resistors R120 and R121 in FIG. 5. As shown in FIG. 5, the voltage regulator 121 is equivalent to an adjustable Zener diode, and the magnitude of the output voltage Vo provided at the cathode terminal K depends on the voltage division ratio of the resistors R120 and R121. When the resistance values of the resistors R120 and R121 are decided, the resistors R120 and R121 divide the output voltage Vo and feed it back to the voltage regulator 121. As the input voltage Vin increases, the output voltage Vo increases, and the feedback amount also increases. Accordingly, the division of the voltage regulator 121 increases, which causes the output voltage Vo to decrease. Thereby, the output voltage Vo would be stabilized under the condition that the reference voltage Vref is equal to the reference source 123 of the voltage regulator 121, and Vo=(1+R120/R121) Vref at this time.

Figure 6:
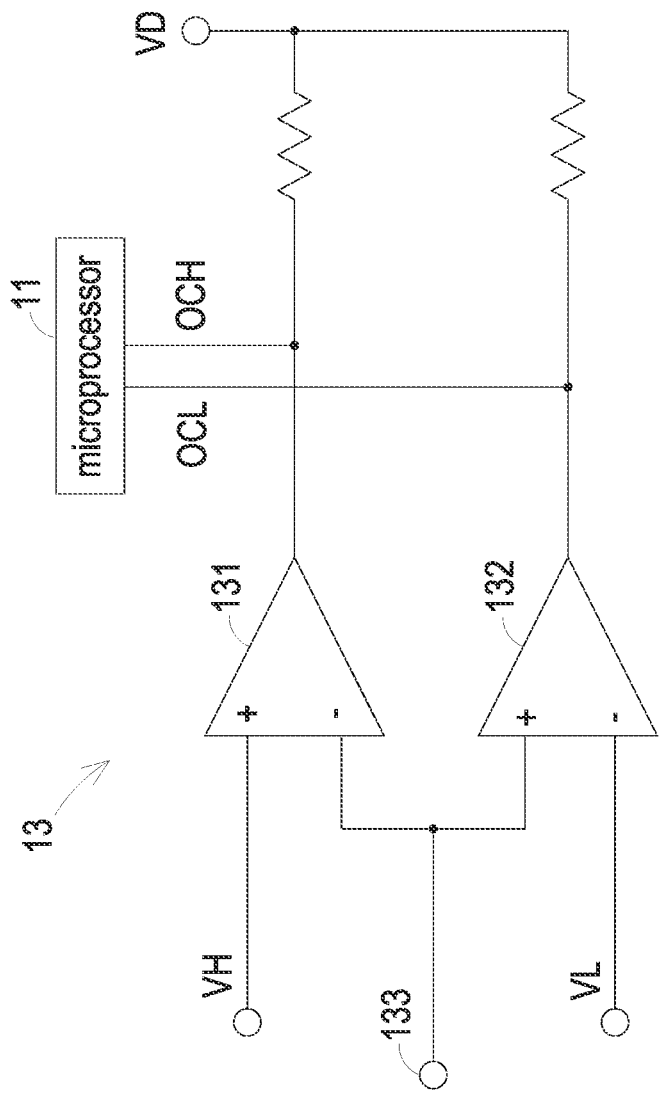
FIG. 6 is a schematic circuit diagram illustrating the overcurrent protection circuit of FIG. 1.

FIG. 6 is a schematic circuit diagram illustrating the overcurrent protection circuit of FIG. 1. In an embodiment, as shown in FIG. 6, the overcurrent protection circuit 13 includes a first comparator 131 and a second comparator 132. An anode terminal of the first comparator 131 is coupled to a high voltage threshold VH, and an output terminal of the first comparator 131 is coupled to a detection voltage VD of the microprocessor 11. A cathode terminal of the second comparator 132 is coupled to a low voltage threshold VL, an output terminal of the second comparator 132 is coupled to the detection voltage VD, and an anode terminal of the second comparator 132 is coupled to a cathode terminal of the first comparator 131 to form a detection input terminal 133. The detection input terminal 133 is configured to receive a writing test signal from the microprocessor 11 or a reading voltage signal from the program burning interface 2.

Under the circumstances that the detection input terminal 133 receives the writing test signal from the microprocessor 11, if the writing test signal is higher than the high voltage threshold VH, the first comparator 131 outputs a first low voltage. A first triggering current is formed between the first low voltage and the detection voltage VD, and the microprocessor 11 receives the first triggering current to trigger the overcurrent protection OCH. Alternatively, if the writing test signal is lower than the low voltage threshold VL, the second comparator 132 outputs a second low voltage. A second triggering current is formed between the second low voltage and the detection voltage VD, and the microprocessor 11 receives the second triggering current to trigger the undercurrent protection OCL.

Under the circumstance that the detection input terminal 133 receives the reading voltage signal from the program burning interface 2, if the reading voltage signal is higher than the high voltage threshold VH, the first comparator 131 outputs the first low voltage. The first triggering current is formed between the first low voltage and the detection voltage VD, and the microprocessor 11 receives the first triggering current to trigger the overcurrent protection OCH. Alternatively, if the reading voltage signal is lower than the low voltage threshold VL, the second comparator 132 outputs the second low voltage. The second triggering current is formed between the second low voltage and the detection voltage VD, and the microprocessor 11 receives the second triggering current to trigger the undercurrent protection OCL.

In conclusion, the present disclosure provides a program burning device and a current-protection detection method. The overcurrent protection circuit is actively tested by utilizing the programming drive circuit with the microprocessor. Consequently, the overcurrent protection circuit is ensured to operate normally, and the failure of the current protection function caused by the abnormal overcurrent protection circuit is avoided. Whenever the system starts up, the program burning device of the present disclosure performs the current-protection detection method to test the overcurrent protection circuit. If the overcurrent protection circuit is detected to be abnormal, the program burning device sends out a warning to the system.

While the disclosure has been described in terms of what is presently considered to be the most practical and preferred embodiments, it is to be understood that the disclosure needs not be limited to the disclosed embodiment.

What is claimed is:

1. A program burning device, configured to read or write to a program burning interface, wherein the program burning device comprises:
   a microprocessor, configured to output a first test signal or a second test signal, wherein the first test signal has a high voltage level, and the second test signal has a low voltage level;
   a programming drive circuit, controlled by the microprocessor to output a high driving voltage or a low driving voltage to the program burning interface; and
   an overcurrent protection circuit, coupled to the first and second test signals for triggering an overcurrent protection or an undercurrent protection through the microprocessor,
   wherein after the programming drive circuit outputs the low driving voltage for a preset time, the programming drive circuit outputs the high driving voltage to make the program burning interface form a high impedance,
   wherein after the program burning interface forms the high impedance, the overcurrent protection circuit receives the first test signal to trigger the overcurrent protection, and the overcurrent protection circuit receives the second test signal to trigger the undercurrent protection after the overcurrent protection is triggered,
   wherein if triggering the overcurrent protection and the undercurrent protection are continuously failed over a preset number of times, the microprocessor determines that a current protection is failed.

2. The program burning device according to claim 1, wherein if triggering the overcurrent protection and the undercurrent protection are continuously failed less than the preset number of times, the microprocessor determines that the current protection is normal.

3. The program burning device according to claim 2, wherein when the microprocessor determines that the current protection is normal, the microprocessor controls the programming drive circuit to read or write to the program burning interface.

4. The program burning device according to claim 1, wherein the programming drive circuit comprises:

a voltage regulator, comprising a cathode terminal, an anode terminal connected to a ground voltage, and a reference terminal providing a reference voltage;
an NPN transistor, wherein a collector terminal of the NPN transistor is coupled to a high voltage source, and a base terminal of the NPN transistor is coupled to the cathode terminal;
a first resistor, wherein a first terminal of the first resistor is connected to an emitter terminal of the NPN transistor to form a driving output terminal of the programming drive circuit, and a second terminal of the first resistor is connected to the reference terminal;
a second resistor, wherein a first terminal of the second resistor is connected to the reference terminal, and a second terminal of the second resistor is connected to the ground voltage;
a third resistor, wherein a first terminal of the third resistor is connected to the reference terminal; and
a field effect transistor, wherein a drain terminal of the field effect transistor is connected to a second terminal of the third resistor, a source terminal of the field effect transistor is connected to the ground voltage, and a gate terminal of the field effect transistor is coupled to the microprocessor.

5. The program burning device according to claim 4, wherein the programming drive circuit provides the high driving voltage or the low driving voltage to the program burning interface through the driving output terminal.

6. The program burning device according to claim 5, wherein when the microprocessor turns on the field effect transistor, the programming drive circuit provides the high driving voltage through the driving output terminal; and wherein when the program burning interface receives the high driving voltage, the microprocessor reads or writes data to the program burning interface.

7. The program burning device according to claim 5, wherein when the microprocessor turns off the field effect transistor, the programming drive circuit provides the low driving voltage through the driving output terminal; and wherein when the program burning interface receives the low driving voltage, the microprocessor reads a voltage signal from the program burning interface.

8. The program burning device according to claim 1, wherein the overcurrent protection circuit comprises:
   a first comparator, wherein an anode terminal of the first comparator is coupled to a high voltage threshold, and an output terminal of the first comparator is coupled to a detection voltage of the microprocessor; and
   a second comparator, wherein a cathode terminal of the second comparator is coupled to a low voltage threshold, an output terminal of the second comparator is coupled to the detection voltage, and an anode terminal of the second comparator is coupled to a cathode terminal of the first comparator to form a detection input terminal,
   wherein the detection input terminal is configured to receive a writing test signal from the microprocessor or a reading voltage signal from the program burning interface.

9. The program burning device according to claim 8, wherein when the writing test signal is higher than the high voltage threshold, the first comparator outputs a first low voltage, a first triggering current is formed between the first low voltage and the detection voltage, and the microprocessor receives the first triggering current to trigger the overcurrent protection;

wherein when the writing test signal is lower than the low voltage threshold, the second comparator outputs a second low voltage, a second triggering current is formed between the second low voltage and the detection voltage, and the microprocessor receives the second triggering current to trigger the undercurrent protection.

10. The program burning device according to claim 8, wherein when the reading voltage signal is higher than the high voltage threshold, the first comparator outputs a first low voltage, a first triggering current is formed between the first low voltage and the detection voltage, and the microprocessor receives the first triggering current to trigger the overcurrent protection;

wherein when the reading voltage signal is lower than the low voltage threshold, the second comparator outputs a second low voltage, a second triggering current is formed between the second low voltage and the detection voltage, and the microprocessor receives the second triggering current to trigger the undercurrent protection.

11. A current-protection detection method of a program burning device, wherein the program burning device is configured to read or write to a program burning interface, and the current-protection detection method comprises:

providing a first test signal or a second test signal by a microprocessor, wherein the first test signal has a high voltage level, and the second test signal has a low voltage level;

controlling a programming drive circuit to provide a high driving voltage or a low driving voltage by the microprocessor;

receiving the first and second test signals by an overcurrent protection circuit for triggering an overcurrent protection or an undercurrent protection through the microprocessor;

providing the low driving voltage to the program burning interface for a preset time;

providing the high driving voltage to the program burning interface after the preset time to make the program burning interface form a high impedance;

after forming the high impedance, receiving the first test signal by the overcurrent protection circuit to trigger the overcurrent protection; and after triggering the overcurrent protection, receiving the second test signal by the overcurrent protection circuit to trigger the undercurrent protection, wherein if triggering the overcurrent protection and the undercurrent protection are continuously failed over a preset number of times, the microprocessor determines that a current protection is failed.

12. The current-protection detection method according to claim 11, wherein if triggering the overcurrent protection and the undercurrent protection are continuously failed less than the preset number of times, the microprocessor determines that the current protection is normal once the overcurrent protection and the undercurrent protection are triggered successfully.

13. The current-protection detection method according to claim 12, wherein when the microprocessor determines that the current protection is normal, the microprocessor controls the programming drive circuit to read or write to the program burning interface.

* * * * *